(12) United States Patent
Sato et al.

(10) Patent No.: US 8,502,217 B2
(45) Date of Patent: Aug. 6, 2013

(54) OXIDE SEMICONDUCTOR DEVICE INCLUDING INSULATING LAYER AND DISPLAY APPARATUS USING THE SAME

(75) Inventors: Ayumu Sato, Kawasaki (JP); Ryo Hayashi, Yokohama (JP); Hisato Yabuta, Machida (JP); Tomohiro Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 444 days.

(21) Appl. No.: 12/679,901

(22) PCT Filed: Nov. 27, 2008

(86) PCT No.: PCT/JP2008/071989
§ 371 (c)(1),
(2), (4) Date: Mar. 24, 2010

(87) PCT Pub. No.: WO2009/072532
PCT Pub. Date: Jun. 11, 2009

(65) Prior Publication Data
US 2010/0283049 A1    Nov. 11, 2010

(30) Foreign Application Priority Data
Dec. 4, 2007    (JP) .................. 2007-313579

(51) Int. Cl.
    H01L 29/12      (2006.01)
    H01L 23/04      (2006.01)
    H01L 31/036     (2006.01)
    H01L 31/0376    (2006.01)
    H01L 27/01      (2006.01)
(52) U.S. Cl.
    USPC .............. 257/43; 257/53; 257/72; 257/350; 257/347

(58) Field of Classification Search
    USPC ............... 257/43, 57, 59, 350, 72, 347, 646
    See application file for complete search history.

(56) References Cited

U.S. PATENT DOCUMENTS 6,331,474 B1    12/2001    Hayashi et al.
6,563,174 B2     5/2003    Kawasaki et al.
(Continued)

FOREIGN PATENT DOCUMENTS

EP    1 770 788 A2    4/2007
JP    63-101740 A     5/1988
(Continued)

OTHER PUBLICATIONS

PCT International Search Report and Written Opinion of the International Searching Authority, International Application No. PCT/JP2008/071989, Mailing Date Apr. 7, 2009.

(Continued)

*Primary Examiner* — Chuong A. Luu
(74) *Attorney, Agent, or Firm* — Fitzpatrick, Cella, Harper & Scinto

(57) ABSTRACT

Provided is an oxide semiconductor device including an oxide semiconductor layer and an insulating layer coming into contact with the oxide semiconductor layer in which the insulating layer includes: a first insulating layer coming into contact with an oxide semiconductor, having a thickness of 50 nm or more, and including an oxide containing Si and O; a second insulating layer coming into contact with the first insulating layer, having a thickness of 50 nm or more, and including a nitride containing Si and N; and a third insulating layer coming into contact with the second insulating layer, the first insulating layer and the second insulating layer having hydrogen contents of $4 \times 10^{21}$ atoms/cm$^3$ or less, and the third insulating layer having a hydrogen content of more than $4 \times 10^{21}$ atoms/cm$^3$.

9 Claims, 10 Drawing Sheets

U.S. PATENT DOCUMENTS

| | | |
|---|---|---|
| 6,794,275 B2 | 9/2004 | Kondo et al. |
| 6,855,621 B2 | 2/2005 | Kondo et al. |
| 6,858,308 B2 | 2/2005 | Kondo et al. |
| 7,282,132 B2 | 10/2007 | Iwata et al. |
| 7,674,650 B2 | 3/2010 | Akimoto et al. |
| 2006/0244107 A1 | 11/2006 | Sugihara et al. |
| 2007/0052025 A1 | 3/2007 | Yabuta |
| 2007/0090365 A1 | 4/2007 | Hayashi et al. |
| 2009/0050953 A1* | 2/2009 | Wang et al. .................. 257/324 |
| 2009/0325341 A1 | 12/2009 | Itagaki et al. |
| 2010/0019312 A1* | 1/2010 | Sekine et al. ................ 257/326 |
| 2010/0051936 A1 | 3/2010 | Hayashi et al. |
| 2010/0051938 A1 | 3/2010 | Hayashi et al. |
| 2010/0051947 A1 | 3/2010 | Yabuta et al. |
| 2010/0065837 A1 | 3/2010 | Omura et al. |

FOREIGN PATENT DOCUMENTS

| | | |
|---|---|---|
| JP | 2002-76356 A | 3/2002 |
| JP | 2003-86808 A | 3/2003 |
| JP | 2005-33172 A | 2/2005 |
| JP | 2007-73559 A | 3/2007 |
| JP | 2007-73560 A | 3/2007 |
| JP | 2007-73562 A | 3/2007 |
| JP | 2007-123861 A | 5/2007 |
| JP | 2007-194594 A | 8/2007 |
| JP | 2007-220818 A | 8/2007 |

OTHER PUBLICATIONS

Kim, et al., "Highly Stable Ga2O3-In2O3-ZnO TFT for Active-Matrix Organic Light-Emitting Diode Display Application", IEEE International Electron Devices Meeting Proceedings, 2006.

Taiwanese Office Action dated Dec. 18, 2012 in Taiwanese Application No. 097146793.

* cited by examiner

OXIDE SEMICONDUCTOR DEVICE INCLUDING INSULATING LAYER AND DISPLAY APPARATUS USING THE SAME

TECHNICAL FIELD

The present invention relates to an oxide semiconductor device. More particularly, the present invention relates to an oxide semiconductor device including an insulating layer and to a display apparatus which is an application example of the oxide semiconductor device.

BACKGROUND ART

In recent years, thin film transistors (TFTs) including a channel layer of a transparent conductive oxide polycrystalline thin film containing zinc oxide (ZnO) as a main component have actively been developed (Japanese Patent Application Laid-Open No. 2002-076356).

The transparent conductive oxide polycrystalline thin film can be formed at low temperature and is transparent with respect to a visible light, and hence a flexible transparent TFT can be formed on a substrate such as a plastic plate or a film.

However, an oxide semiconductor containing ZnO has high sensitivity with respect to an atmosphere, and hence, in order to put the oxide semiconductor into practical use as a semiconductor device, it is necessary to isolate a semiconductor layer thereof from an atmosphere with the use of a protective layer (Japanese Patent Application Laid-Open No. S63-101740). In addition, there is also a description in that a silicon oxide ($SiO_2$) layer can be formed on an interface with the oxide semiconductor including an isolation layer used as a protective layer of a field effect transistor which uses ZnO as a semiconductor layer (U.S. Patent Application Publication No. 2006/0244107).

Besides, it is disclosed that, in a thin film transistor including an oxide semiconductor film using ZnO or the like, an insulating layer formed of two layers is employed (U.S. Pat. No. 6,563,174). In this case, the insulating layer forming an interface with a semiconductor is assumed to be an oxide insulator, for example, $SiO_2$. Further, other insulators are formed of silicon nitride ($SiN_z$) having high insulating property. With this structure, improvement of crystallinity of the oxide semiconductor film and reduction of interface defect level can be expected.

Moreover, it is known that, in an oxide semiconductor device using ZnO as a main component, when silicon nitride ($SiN_x$) formed by plasma enhanced chemical vapor deposition (also referred to as PECVD) is used as a gate insulating layer, the following problem occurs. In other words, because hydrogen concentration is high in the insulating layer, reductive desorption of a ZnO component occurs, and hence resistance of a ZnO surface layer is lowered. Then, as avoidance measures therefor, it is disclosed that the hydrogen concentration of an interface side with the oxide semiconductor is reduced (Japanese Patent Application Laid-Open No. 2007-073562).

The inventors of the present invention have examined the oxide semiconductor devices including an In—Ga—Zn—O amorphous oxide semiconductor device, and it has been confirmed that the resistance of the oxide semiconductor under reducing atmosphere changes greatly (changes into low resistance). In order to reduce its influence, it is also known to be effective that the oxide semiconductor is previously manufactured to have high resistance to allow for an amount of resistance change and is subsequently subjected to annealing at a temperature equal to or higher than 300° C. (C. J. Kim et. al, IEEE International Electron Devices Meeting Proceedings, 2006). However, it is difficult to apply this method to a plastic substrate or the like with low heat resistance, because the substrate itself does not have sufficient heat resistance to a manufacturing temperature or an anneal temperature for the oxide semiconductor. Further, generally, the above-mentioned substrate with low heat resistance for a low temperature process has high gas-transmission property or high gas-release property, and hence it is indispensable to form a barrier coating layer for suppressing an influence on the semiconductor device. Therefore, in the substrate for a low temperature process, which is represented by the plastic substrate, a barrier layer such as a barrier coating layer or a protective layer is required to be formed in a region of a low temperature equal to or lower than 250° C. As a formation method for the barrier layer, there is generally used PECVD which provides a higher film formation rate and excellent productivity. However, an insulating layer functioning as the barrier layer such as the barrier coating layer or the protective layer, which is formed by PECVD, contains a large amount of in-film hydrogen (amount of hydrogen contained in the insulating layer), and hence the oxide semiconductor cannot be formed without making the oxide semiconductor have lower resistance. (Hereinafter, the barrier coating layer and the protective layer are collectively referred to as barrier layer in this description.)

Japanese Patent Application Laid-Open No. 2007-073562 discloses that $SiN_x$ formed by PECVD at a temperature of 250° C. has less hydrogen content and is effective as an insulating layer which comes into contact with the oxide semiconductor. However, when the inventors of the present invention used the $SiN_x$ formed by PECVD at a temperature of 250° C. as the insulating layer which comes into contact with the oxide semiconductor, it was found that lowering of the resistance of the oxide semiconductor was not sufficiently suppressed in the case of not performing annealing at a temperature higher than 250° C. U.S. Pat. No. 6,563,174 describes that insertion of an oxide insulating layer is effective in improving crystallinity of the oxide semiconductor and in reducing the interface level density, but it was found that hydrogen diffusion from $SiN_z$ could not be stopped in the film formation performed at a temperature equal to or lower than 250° C., which was not sufficient to suppress lowering of the resistance of the oxide semiconductor. In U.S. Pat. No. 6,563,174, the improvement of crystallinity of crystal ZnO is put into focus, and hence there is no description of the low temperature process with the highest temperature set to 250° C. or lower, nor disclosure in that the amount of in-film hydrogen greatly relates to conditions for suppressing the lowering of the resistance of the oxide semiconductor.

As described above, the structure of a practicable oxide semiconductor device, in which the oxide semiconductor device is stably manufactured by the low temperature process at the temperature equal to or lower than 250° C., has not been clear. Therefore, a display apparatus using the oxide semiconductor device manufactured by the low temperature process has not achieved its practical use.

DISCLOSURE OF THE INVENTION

It is an object of the present invention to solve the above-mentioned problems and to provide a structure of an oxide semiconductor and an insulating layer, which form a practical oxide semiconductor device, and a display apparatus using the practical oxide semiconductor device.

According to an aspect of the present invention, there is provided an oxide semiconductor device including an insulating layer, in which the insulating layer includes: a first insulating layer coming into contact with an oxide semiconductor, having a thickness of 50 nm or more, and including an oxide containing Si and O; a second insulating layer coming into contact with the first insulating layer, having a thickness of 50 nm or more, and including a nitride containing Si and N; and a third insulating layer coming into contact with the second insulating layer.

According to the aspect of the present invention, the first insulating layer and the second insulating layer have hydrogen contents of $4 \times 10^{21}$ atoms/cm$^3$ or less, and the third insulating layer has a hydrogen content of more than $4 \times 10^{21}$ atoms/cm$^3$.

According to the aspect of the present invention, the first insulating layer includes $SiO_x$, the second insulating layer includes $SiN_y$, and the third insulating layer includes one of $SiN_z$ and $SiO_mN_n$.

According to the aspect of the present invention, the first insulating layer and the second insulating layer are continuously formed to be an insulating layer.

According to the aspect of the present invention, the oxide semiconductor includes an amorphous oxide semiconductor containing at least one element selected from the group consisting of Sn, In, and Zn.

According to the aspect of the present invention, at least a part of the first insulating layer, the second insulating layer, and the third insulating layer is used as a gate insulating layer.

According to another aspect of the present invention, there is provided a display apparatus including: a display device including an electrode; and a field effect transistor including a source electrode and a drain electrode, one of the source electrode and the drain electrode of the field effect transistor being connected to the electrode of the display device on a substrate. In the display apparatus, the field effect transistor includes any one of the oxide semiconductor devices described above.

According to the another aspect of the present invention, the display device includes an electroluminescence device.

According to the another aspect of the present invention, the display device includes a liquid crystal cell.

According to the another aspect of the present invention, a plurality of the display devices and a plurality of the field effect transistors are two-dimensionally arranged on the substrate.

According to the present invention, lowering of the resistance of the semiconductor layer, which is caused by water in the atmosphere, hydrogen diffused from the barrier layer (from the barrier coating layer and the protective layer), and water or hydrogen diffused from the substrate, can be effectively suppressed. Further, there can be provided an oxide semiconductor device which can be formed at a temperature of 250° C. or less by the low temperature process using the barrier layer containing hydrogen at more than $4 \times 10^{21}$ atoms/cm$^3$ and which has high productivity. Besides, PECVD can be used as a formation method for the barrier layer.

BEST MODE FOR CARRYING OUT THE INVENTION

Hereinafter, an oxide semiconductor device including an insulating layer and a display apparatus using the oxide semiconductor device according to the present invention are described in detail with reference to the drawings.

Figure 1A:
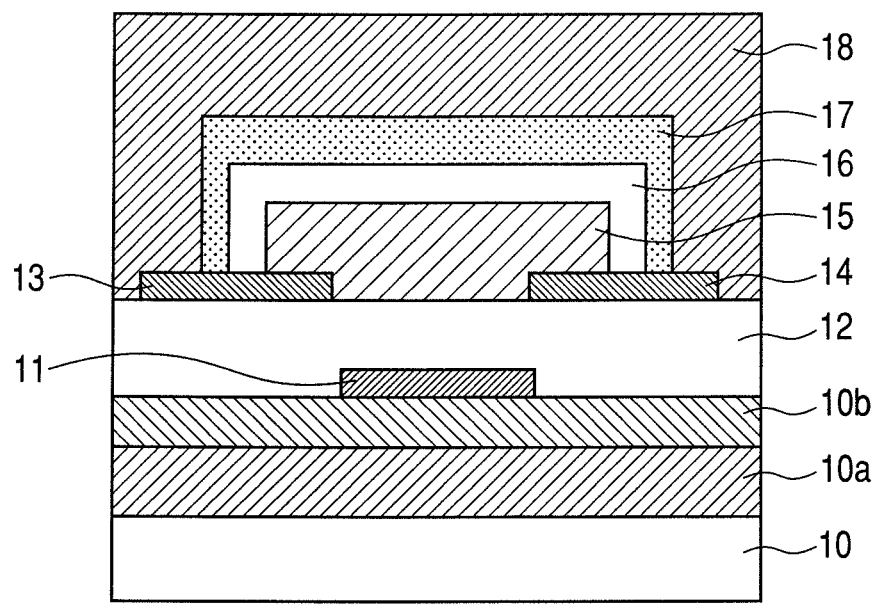
FIGS. 1A and 1B are schematic views illustrating a bottom-gate/bottom-contact oxide semiconductor field effect transistor in which an insulating layer of the present invention is used as both an underlying layer and a protective layer.
Figure 1B:
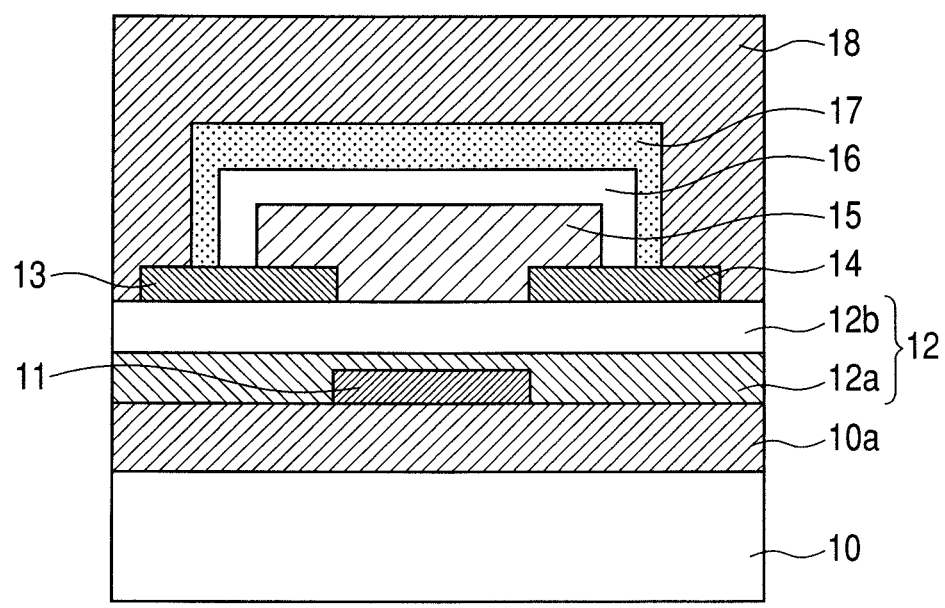

FIGS. 1A and 1B illustrate a structural example of a bottom-gate/bottom-contact field effect transistor which is a representative oxide semiconductor device including an insulating layer structure according to the present invention.

FIG. 1A illustrates a substrate 10, a third insulating layer 10a functioning as a barrier coating layer, a second insulating layer 10b, a gate electrode 11, a first insulating layer 12 functioning as a gate insulating layer, a source electrode 13, a drain electrode 14, an oxide semiconductor layer 15, a first insulating layer 16 functioning as a protective layer, a second insulating layer 17 functioning as the protective layer, and a third insulating layer 18 functioning as the protective layer.

FIG. 1B illustrates the substrate 10, the third insulating layer 10a functioning as a barrier coating layer, the gate electrode 11, a second insulating layer 12a functioning as a first gate insulating layer, a first insulating layer 12b functioning as a second gate insulating layer, the source electrode 13, the drain electrode 14, the oxide semiconductor layer 15, the first insulating layer 16 functioning as a protective layer, the second insulating layer 17 functioning as the protective layer, and the third insulating layer 18 functioning as the protective layer. Note that the same reference symbols denote the same components described above in the subsequent drawings.

(Substrate)

As the substrate 10 forming the oxide semiconductor device illustrated in FIGS. 1A and 1B, there can be used a substrate which is usable in the following low temperature process. Specifically, there can be used a plastic film or a sheet which is made of polyethylene terephthalate (PET), polyethylene naphthalate (PEN), polyimide, or polycarbonate, and is effective in a process performed at a temperature of 250° C. or less. Note that such a substrate for the low temperature process has high gas-transmission property or gas-release property in general, and hence it is required to form the barrier coating layer 10a so as to suppress an influence on the oxide semiconductor layer 15. Further, also with respect to a low-alkali glass substrate, it is required to use the barrier coating layer 10a for preventing an alkali metal element from diffusing into the gate insulating layer 12 of FIG. 1A or into the second and first gate insulating layers 12a and 12b of FIG. 1B during a process of forming the oxide semiconductor device. Further, it is required to use the barrier coating layer 10a for preventing the alkali metal element from diffusing into the oxide semiconductor layer 15.

(Oxide Semiconductor Layer)

For the oxide semiconductor layer 15 illustrated in FIGS. 1A and 1B, an amorphous oxide containing at least one element selected from the group consisting of Sn, In, and Zn can be used.

Further, in the case where Sn is selected as at least one of constituent elements of the amorphous oxide, Sn can be substituted with $Sn_{1-p}M4_p$ ($0<p<1$, M4 is selected from the group consisting of Si, Ge, and Zr which are group IV elements having an atomic number smaller than that of Sn).

Further, in the case where In is selected as at least one of constituent elements of the amorphous oxide, In can be substituted with $In_{1-q}M3_q$ ($0<q<1$, M3 is Lu, or is selected from the group consisting of B, Al, Ga, and Y which are group III elements having an atomic number smaller than that of In).

Further, in the case where Zn is selected as at least one of constituent elements of the amorphous oxide, Zn can be substituted with $Zn_{1-r}M2_r$ ($0<r<1$, M2 is selected from the group consisting of Mg and Ca which are group II elements having an atomic number smaller than that of Zn).

Specific amorphous materials capable of being applied to the present invention include an Sn—In—Zn oxide, an In—Zn—Ga—Mg oxide, an In oxide, an In—Sn oxide, an In—Ga oxide, an In—Zn oxide, a Zn—Ga oxide, and an Sn—In—Zn oxide. A composition ratio of constituent metal atoms is not necessarily set to 1:1. Note that, in the case where Zn or Sn is used alone and it may be difficult to produce an amorphous, In is added thereto, whereby an amorphous phase is easy to be produced. For example, in the case of In—Zn system, a proportion of the number of atoms except oxygen may be set to a composition containing In of about 20 atomic % or more. In the case of Sn—In system, the proportion of the number of atoms except oxygen may be set to a composition containing In of about 80 atomic % or more. In the case of Sn—In—Zn system, the proportion of the number of atoms except oxygen may be set to a composition containing In of about 15 atomic % or more.

When a thin film to be detected is subjected to X-ray diffraction at a low incident angle of about 0.5 degrees and then a clear diffraction peak is not detected (that is, halo pattern is observed), it can be determined that the thin film has the amorphous structure. Note that, according to the present invention, when the above-mentioned materials are used for the oxide semiconductor device, it is not excluded that the semiconductor layer contains a constituent material with a microcrystal state.

(Insulating Layer)

The insulating layer according to the present invention is required to have a function of suppressing reduction of an oxide semiconductor. This reduction suppressing function needs two different functions: a function of preventing reduction of the oxide semiconductor caused by the insulating layer itself; and a function of suppressing diffusion of hydrogen atoms, which are diffused from a barrier layer, into the oxide semiconductor layer.

The first insulating layer is formed of an oxide having a function of suppressing reduction of an oxide semiconductor which is to come into contact with the first insulating layer. Specifically, $SiO_x$ with a thickness of 50 nm or more is desirable, and more preferably, silicon oxide ($SiO_x$) having a hydrogen content of $4 \times 10^{21}$ atoms/cm$^3$ or less is desirable. In this description, in order to indicate that an $SiO_2$ composition can be used even when deviated from stoichiometry, notation of $SiO_x$ is used. In the present invention, there are no particular limitations on a lower limit value of the hydrogen content of the first insulating layer. As long as the insulation performance as designed can be secured, the hydrogen content may be small, and in theory, may be zero. In order to reduce the hydrogen content as described above, the first insulating layer is desirably formed by sputtering.

According to the knowledge of the inventors of the present invention, there is no particular upper limit on a thickness of the $SiO_x$ layer (also referred to as $SiO_x$ film) as long as the function of suppressing reduction of the oxide semiconductor works so as not to exert an adverse influence on characteristics of other devices. Required characteristics of a device (for example, TFT), a tact time in manufacturing processes, and the like may be taken into consideration to appropriately determine the thickness of the $SiO_x$ layer. In the present invention, the thickness of the $SiO_x$ layer can be suitably adopted from a thickness range from 50 nm to 10 μm.

Further, in order to confirm the barrier performance of the first insulating layer $SiO_x$, a change in electrical resistance of the oxide semiconductor including only the first insulating layer $SiO_x$ was determined in an atmosphere.

Figure 10:
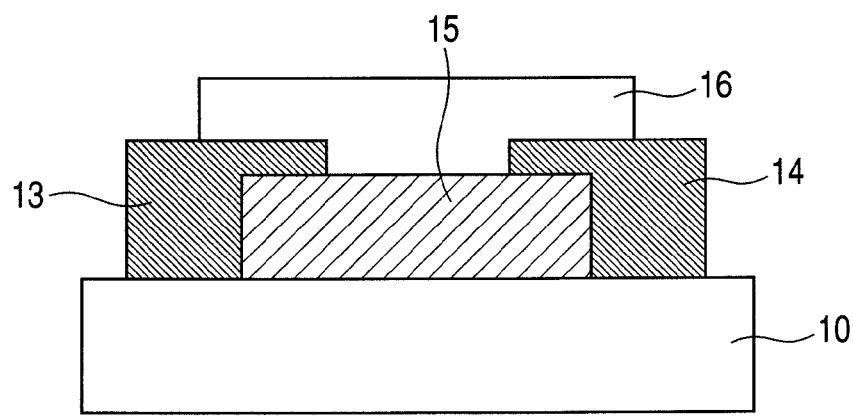
FIG. 10 is a schematic view illustrating a shape of a sample of an In—Ga—Zn—O amorphous oxide film when the In—Ga—Zn—O amorphous oxide is annealed in an atmosphere containing the moisture according to the present invention.

FIG. 10 is a schematic sectional view of a sample manufactured for measuring a change in electrical conductivity of an In—Ga—Zn—O amorphous oxide film which is annealed in an atmosphere containing moisture. This is formed by patterning an $InGaZnO_4$ thin film with a thickness of 20 nm formed on a Corning #1737 glass substrate, forming electrodes, and then, forming by sputtering an $SiO_x$ film with a thickness of 100 nm as a protective layer.

Figure 11:
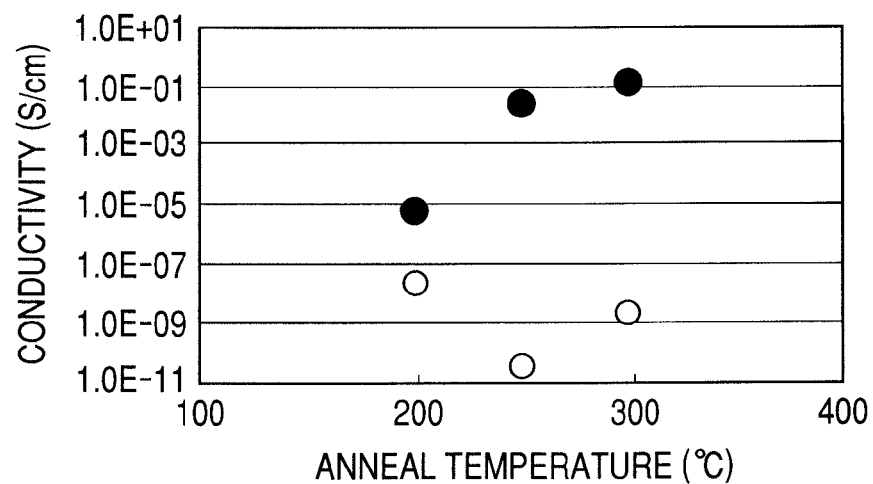
FIG. 11 is a graph showing change in resistivity of an In—Ga—Zn—O amorphous oxide film when the In—Ga—Zn—O amorphous oxide film is annealed in an atmosphere containing the moisture according to the present invention.

FIG. 11 indicates electrical conductivities of the InGaZnO$_4$ thin film, which are obtained when the sample illustrated in FIG. 10 is annealed at 200° C., 250° C., and 300° C., respectively. A symbol ○ denotes electrical conductivity of the sample which is subjected to annealing in the air for one hour, and a symbol ● denotes electrical conductivity of the sample which is subjected to annealing in the air at the respective temperatures for one hour, and further, subjected to steam annealing at the same temperatures for one hour. The steam annealing was performed by vacuum-sealing the sample illustrated in FIG. 10 and pure water within a glass tube. The amount of the pure water at that time was adjusted to be about 2 atmospheres at the used anneal temperatures. As illustrated in FIG. 11, the steam annealing allows steam transmitting through the SiO$_x$ insulating layer with a thickness of 100 nm to reach the oxide semiconductor, and the electrical conductivity of the oxide semiconductor is increased compared with the case of the annealing in the air. The results indicate that carrier density of the oxide semiconductor is increased due to the steam also by a process performed at a temperature of 250° C. or less. It is conceived that the increase of the carrier density is caused by H atoms which are added to the oxide semiconductor by steam. This fact reveals that the SiO$_x$ layer with a thickness of 100 nm alone is not enough to have the function as the barrier layer, and hence another barrier layer is required to be formed.

Figure 2A:
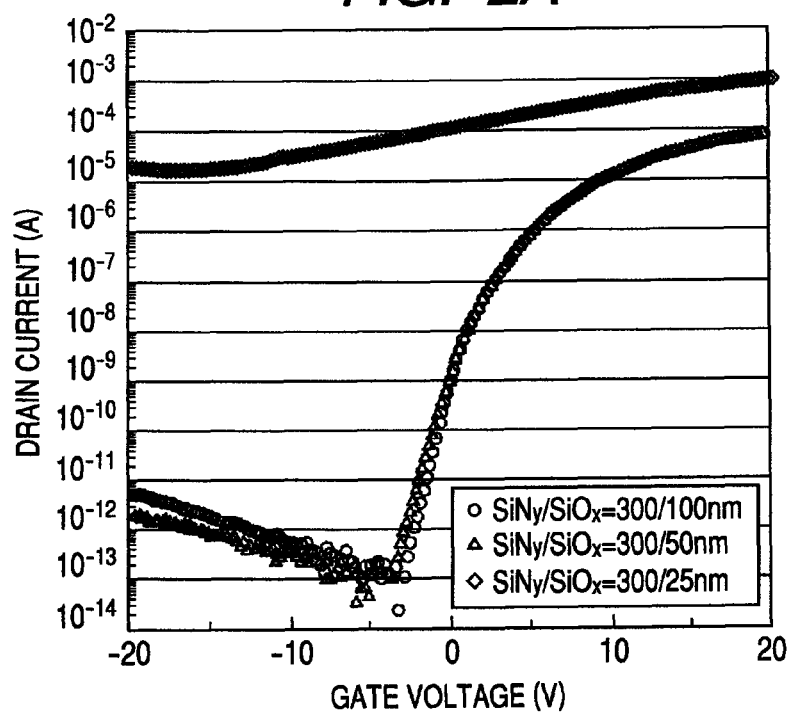
FIGS. 2A and 2B are graphs showing results of determining a drain current (Id) with respect to a gate voltage (Vg) under a condition of a drain voltage (Vd)=12V, in the cases where a thickness of $SiO_x$ used as a first insulating layer is changed to 25 nm, 50 nm, and 100 nm.

Further, in the case of using, as the first insulating layer, SiN$_y$:H which is generally used in a semiconductor device including hydrogenated amorphous silicon, as described in Japanese Patent Application Laid-Open No. 2003-086808, the resistance of the oxide semiconductor layer is reduced. In this case, SiO$_x$ having hydrogen content of $4\times10^{21}$ atoms/cm$^3$ or less, which is formed by sputtering, is used as the first insulating layer, and silicon nitride (SiN$_y$) having hydrogen content of $4\times10^{21}$ atoms/cm$^3$ or less, which is formed by sputtering, is used as the second insulating layer. In this description, in order to indicate that an Si$_3$N$_4$ composition can be used even when deviated from stoichiometry, notation of SiN$_y$ is used. However, as indicated in FIG. 2A, in the case where the thickness of SiO$_x$ is smaller than 50 nm, the reduction suppressing function for the oxide semiconductor is not sufficient. In other words, the first insulating layer which comes contact with the oxide semiconductor is desirably to be SiO$_x$ with a thickness of 50 nm or more.

The second insulating layer is formed of a nitride having the function of preventing hydrogen atoms from being diffused from the third insulating layer (barrier layer) described below which contains a large amount of hydrogen (for example, $5\times10^{21}$ atoms/cm$^3$ or more). (In this description, "a large amount of" means that hydrogen is contained more than $4\times10^{21}$ atoms/cm$^3$.) In addition, as the second insulating layer having the function of preventing hydrogen diffusion due to heat even in the process performed at the highest process temperature of 250° C., SiN$_y$ with a thickness of 50 nm or more is desirably used.

According to the knowledge of the inventors of the present invention, there are no upper limit values on a thickness of the second insulating layer, similarly to the first insulating layer. Required characteristics of a device (for example, TFT), a tact time in manufacturing processes, and the like may be taken into consideration to appropriately determine the thickness of the second insulating layer. In the present invention, the thickness of the SiN$_y$ layer can be suitably adopted from a thickness range from 50 nm or more to 10 µm or less.

Figure 2B:
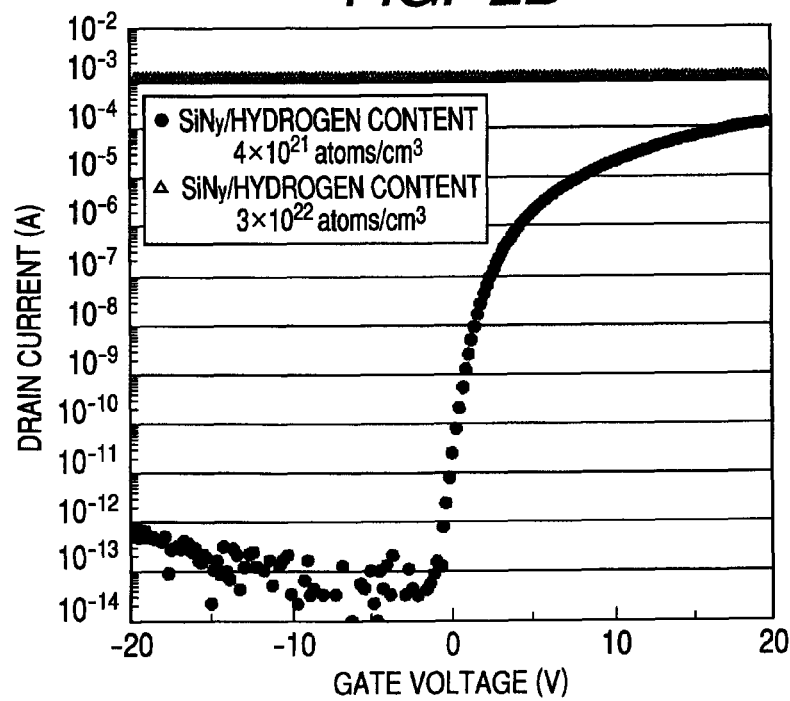

Next, a TFT including the first insulating layer SiO$_x$ and the second insulating layer which serve as the protective films was manufactured, and influence caused by the hydrogen diffusion from the insulating layers was examined by changing the hydrogen content of the second insulating layer. A thickness of SiO$_x$ was set to 200 nm, and a thickness of SiN$_y$ is set to 300 nm, respectively. As a result, there was found a great difference in characteristics between two TFTs, one of which uses the insulating layer SiN$_y$ having a hydrogen content of $4\times10^{21}$ atoms/cm$^3$ for the second insulating layer, and the other of which uses the insulating layer SiN$_y$ having the hydrogen content of $3\times10^{22}$ atoms/cm$^3$ for the second insulating layer. FIG. 2B shows comparison of transfer characteristics of the TFT (●) including the insulating layer SiN$_y$ having hydrogen content of $4\times10^{21}$ atoms/cm$^3$ and the TFT (Δ) including the insulating layer SiN$_y$ having the hydrogen content of $3\times10^{22}$ atoms/cm$^3$. It is found from FIG. 2B that the TFT (Δ) which includes the insulating layer SiN$_y$ having a larger hydrogen content cannot reduce drain current even when a negative gate voltage is applied thereto, and hence the resistance of the oxide semiconductor is lowered. The transfer characteristics of the TFT having the larger hydrogen content are completely made flat because current flows beyond the determination limit of the device used for the determination.

In other words, the hydrogen content of the second insulating layer is desirably set to $4\times10^{21}$ atoms/cm$^3$ or less so as not to supply hydrogen to the first insulating layer having the low function of preventing the hydrogen diffusion and to the oxide semiconductor layer. In the present invention, there are no particular limitations on a lower limit value of the hydrogen content of the second insulating layer. As long as the insulation performance as designed can be secured, the hydrogen content may be small, and in theory, may be zero. Further, in order to realize the layer having a small hydrogen content, the first insulating layer and the second insulating layer are desirably formed by sputtering.

In the present invention, the first insulating layer and the second insulating layer can be successively formed. For the successive formation of the first insulating layer and the second insulating layer by sputtering, for example, an oxygen gas (nitrogen gas) is initially used as a sputtering gas, and gradually exchanged for the nitrogen gas (oxygen gas) to thereby form the first insulating layer and the second insulating layer. Alternatively, in addition to the formation by exchanging the sputtering gases in one sputtering apparatus, the first insulating layer and the second insulating layer can be formed by communicating multiple sputtering apparatuses (deposited film forming chambers) with each other and using different sputtering gases for each deposited film forming chamber. The thus-formed first insulating layer and second insulating layer have concentration distribution of oxygen and nitrogen in a layer thickness direction, in which one of the first insulating layer and second insulating layer contains more oxygen and the other thereof contains more nitrogen. In this case, the concentration distribution of oxygen and nitrogen may be continuous or may be stepwise.

When the first insulating layer and the second insulating layer are formed with the hydrogen content of $4\times10^{21}$ atoms/cm$^3$ or less, sputtering is desirable because the materials thereof do not contain hydride. However, the film formation rate in sputtering is slow in general, and it is difficult to form a film with a thickness of 300 nm or more at low costs. As a result, it is difficult to secure sufficient barrier performance only with the first insulating layer and the second insulating layer. Therefore, it is required to form a barrier layer as the third insulating layer.

As the barrier layer, layers of SiN$_z$, SiO$_m$N$_n$, and SiC containing a large amount of hydrogen and formed by PECVD are generally used. In this description, in order to distinguish the third insulating layer $SiN_v$ having a larger hydrogen content from the second insulating layer $SiN_y$ having a smaller hydrogen content, notation of $SiN_z$ is used for the third insulating layer having a larger hydrogen content. Further, in order to indicate that a composition can be appropriately adjusted in a range having the barrier performance against moisture, notation of $SiO_mN_n$ is used for SiON. Those barrier layers are known to have high shielding performance against oxygen and water (including steam) adversely affecting general semiconductors such as crystallized silicon, amorphous silicon, and organic semiconductors. Besides, compared with sputtering for forming the layers of $SiN_y$ and $SiO_mN_n$, the PECVD provides higher film formation rate and high productivity.

Further, a resin layer can be used as the third insulating layer.

Figure 3:
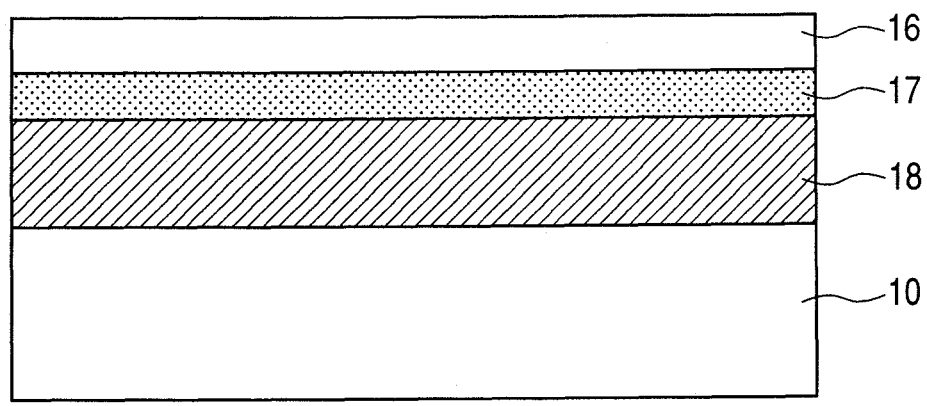
FIG. 3 is a schematic view illustrating a laminated film of insulating layers, which is obtained by forming, on an insulating layer used as a third insulating layer, $SiN_y$ with a thickness of 50 nm or more which comes into no contact with an oxide semiconductor and is used as a second insulating layer, and $SiO_x$ with a thickness of 50 nm or more which is used as the first insulating layer.
Figure 4:
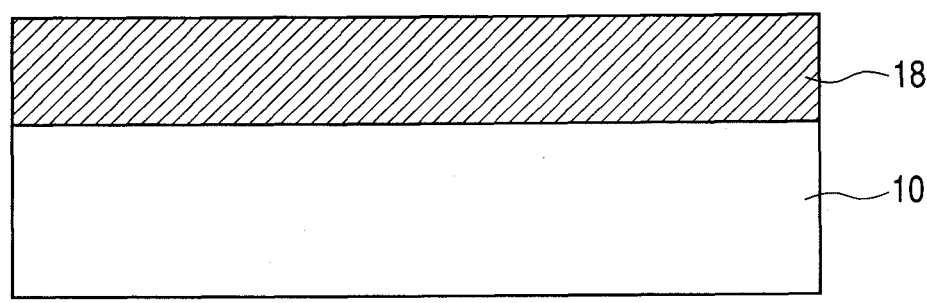
FIG. 4 is a schematic view illustrating a substrate including the insulating layer used as the third insulating layer.
Figure 5:
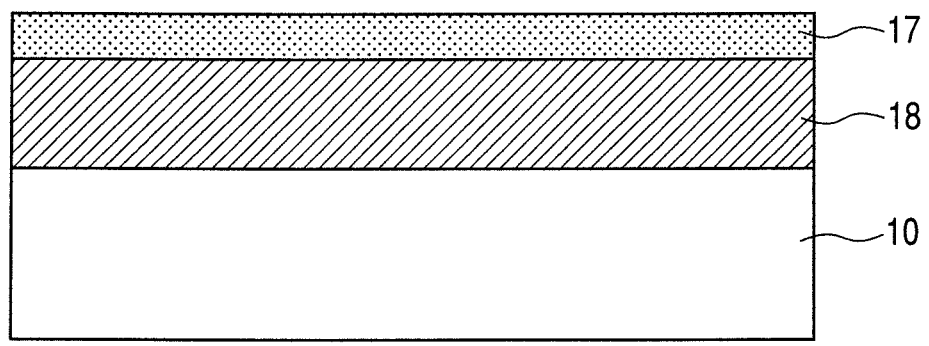
FIG. 5 is a schematic view illustrating a laminated film of insulating layers, which is obtained by forming, on the substrate including the insulating layer used as the third insulating layer, only $SiO_x$ with a thickness of 50 nm or more which is used as the first insulating layer.
Figure 6:
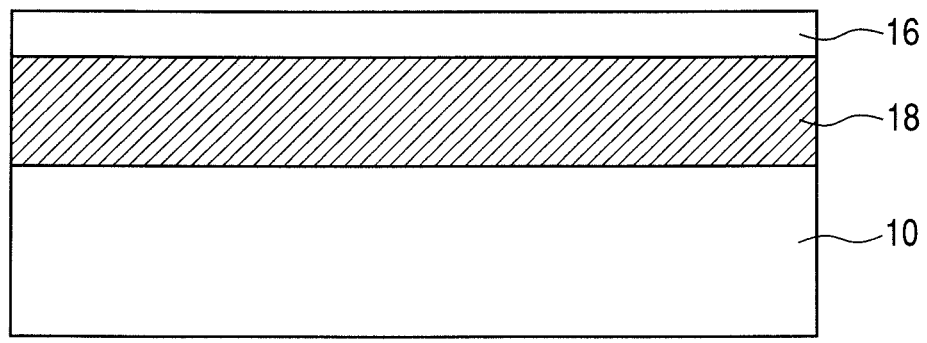
FIG. 6 is a schematic view illustrating a laminated film of insulating layers, which is obtained by forming, on the substrate including the insulating layer used as the third insulating layer, only $SiN_y$ with a thickness of 50 nm or more which is used as the second insulating layer.

Here, effects of preventing the hydrogen diffusion from the third insulating layer by the second insulating layer are described. FIGS. 3 to 6 illustrate the structures of a laminated film of insulating layers, which were used in experiments for the effect verification thereof. A crystallized silicon substrate was used as a substrate in which a hydrogen desorption amount can be ignored. FIG. 4 illustrates the structure in which $SiN_z$ to become the third insulating layer is formed with a thickness of 350 nm on the crystallized silicon substrate by PECVD at a substrate temperature of 250° C. FIG. 5 illustrates $SiN_y$ which becomes the second insulating layer, and FIG. 6 illustrates $SiO_x$ which becomes the first insulating layer, the $SiO_x$ and the $SiN_y$ being directly formed on the third insulating layer of FIG. 4 with a thickness of 50 to 300 nm by sputtering at room temperature. FIG. 3 illustrates the structure in which the second insulating layer and the first insulating layer that are the insulating layers according to the present invention are laminated on the substrate on which the third insulating layer of FIG. 4 is laminated. The first insulating layer which comes into contact with the oxide semiconductor is $SiO_x$ with a thickness of 100 nm, and the second insulating layer which does not come into contact with the oxide semiconductor is $SiN_y$ with a thickness of 50 nm. The both layers of $SiO_x$ and $SiN_y$ were formed at room temperature by sputtering. For the sputtering film formation of $SiO_x$, an $SiO_2$ target with a diameter of 3 inches was used, and a radio frequency (RF) input power was 400 W. The atmosphere at the time of the film formation of $SiO_x$ was set to the total pressure of 0.1 Pa, and a gas flow rate at that time was set to $Ar:O_2=50:50$. Further, for the sputtering of $SiN_y$, an $Si_3N_4$ target with a diameter of 3 inches was used, and the RF input power was 400 W. The atmosphere at the time of the film formation of $SiN_y$ was set to the total pressure of 0.1 Pa, and the gas flow rate at that time was set to $Ar:N_2=50:50$.

The third insulating layer with a thickness of 350 nm, the first insulating layer with a thickness of 300 nm, and the second insulating layer with a thickness of 300 nm illustrated in FIGS. 3 to 6 were subjected to secondary ion mass spectroscopy (SIMS). The third insulating layer of $SiN_z$ contained hydrogen of $3\times10^{22}$ atoms/cm$^3$, the first insulating layer of $SiO_x$ contained hydrogen of $4\times10^{20}$ atoms/cm$^3$, and the second insulating layer of $SiN_y$ contained hydrogen of $1\times10^{20}$ atoms/cm$^3$.

Next, a hydrogen desorption amount of each of the samples illustrated in FIGS. 3 to 6 was determined by the thermal desorption spectroscopy.

The temperature range to be determined was set to temperature of 50° C. to 350° C., which is determined with a thermocouple coming into contact with a substrate surface, and a temperature range used in quantification was set to 50° C. to 250° C.

The desorbed gas was identified as hydrogen by an ion intensity of mass number (m/z) 2 corresponding to $H_2^+$.

Figure 7:
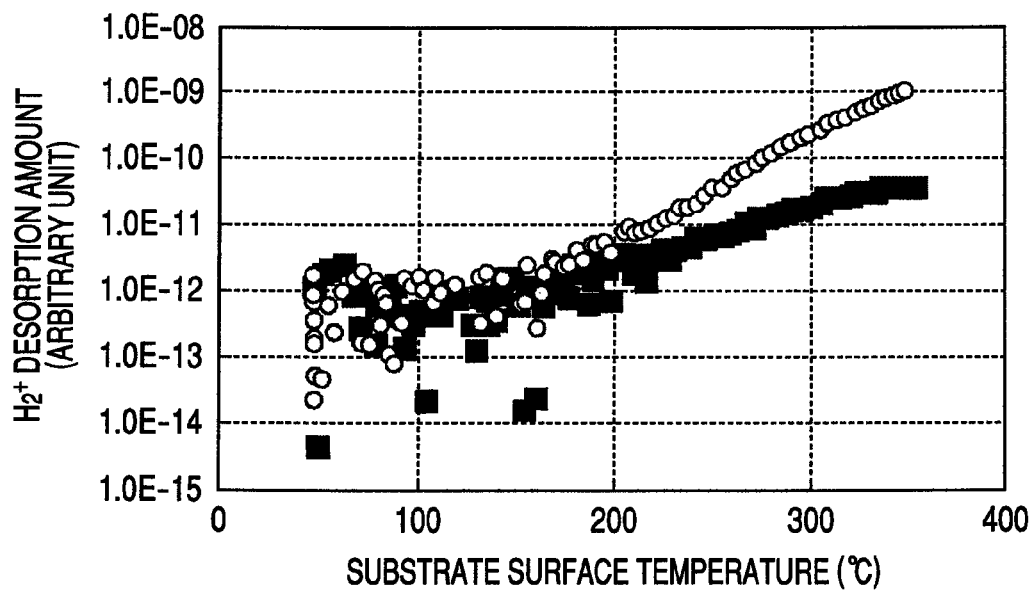
FIG. 7 is a graph showing results of determining the laminated film of insulating layers by a thermal desorption spectroscopy, the laminated film having the structures illustrated in FIGS. 4 and 6.

FIG. 7 shows a hydrogen desorption spectrum (○) of $SiN_z$ which is formed by PECVD and used as the third insulating layer having the structure of FIG. 4, and a spectrum (■) obtained when the second insulating layer is set to a sputter $SiN_y$ with 50 nm having the structure of FIG. 5 and is determined by the thermal desorption spectroscopy. In the third insulating layer $SiN_z$ formed by PECVD and containing a large amount of hydrogen, the desorption of hydrogen begins at about 200° C. Further, the sputter $SiN_y$ with 50 nm serving as the second insulating layer suppresses the desorption of hydrogen from the third insulating layer in the whole range of the substrate temperature up to 350° C., which reveals that the sputter $SiN_y$ has a function of preventing hydrogen diffusion.

Figure 8:
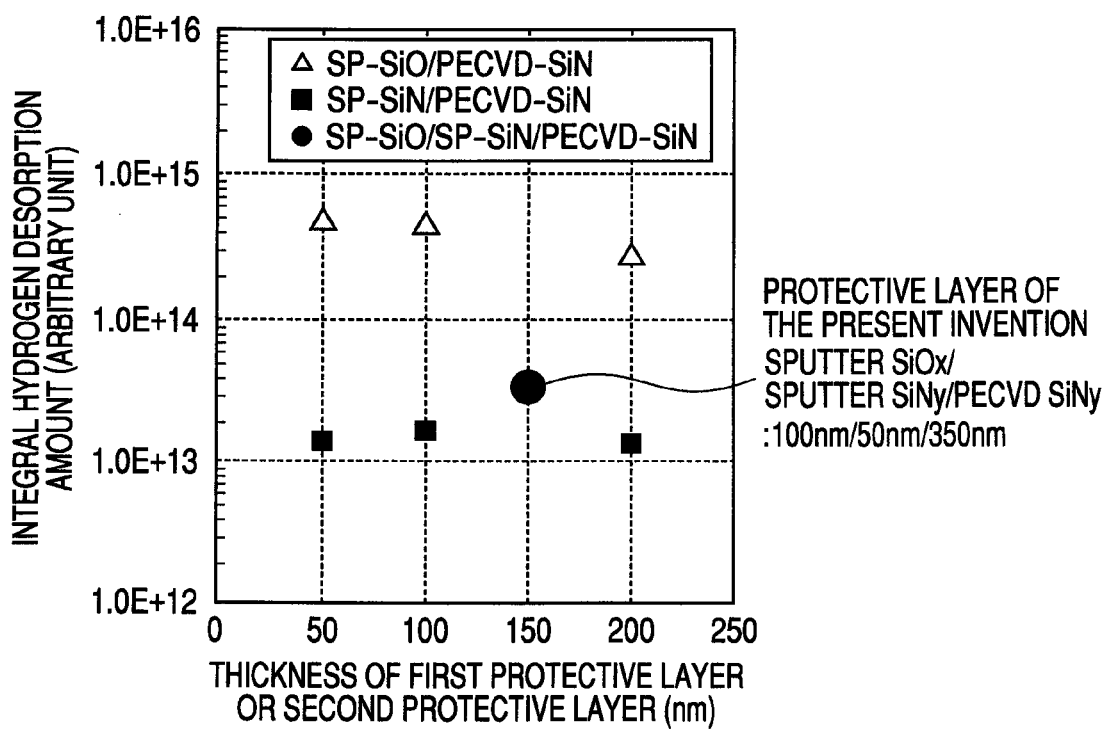
FIG. 8 is a graph showing integral hydrogen desorption amounts in a thermal desorption spectroscopy performed at substrate temperatures of 50° C. to 250° C. in the structures illustrated in FIGS. 3, 5, and 6, while setting an $H_2^+$ desorption amount at a substrate temperature of 50° C. as the background.

FIG. 8 shows integral hydrogen desorption amounts at substrate temperatures of 50° C. to 250° C. in the structures illustrated in FIGS. 5 and 6, while setting an $H_2^+$ desorption amount at a substrate temperature of 50° C. as the background. FIG. 8 shows dependency of the integral hydrogen desorption amounts obtained when a thickness of a sputter $SiO_x$ (△) serving as the first insulating layer in the structure of FIG. 6 and a thickness of the sputter $SiN_y$ (■) serving as the second insulating layer in the structure of FIG. 5 are each changed from 50 nm to 200 nm. Further, a plot of a symbol ● is an integral hydrogen desorption amount obtained when there are used, in the structure of FIG. 3, the sputter $SiO_x$ serving as the first insulating layer with 100 nm, the sputter $SiN_y$ serving as the second insulating layer with 50 nm, and a PECVD $SiN_z$ serving as the third insulating layer with 350 nm according to the present invention.

FIG. 8 shows the integral hydrogen desorption amounts of the insulating layer according to the present invention, which includes three layers of the sputter $SiO_x$ serving as the first insulating layer with 100 nm, the sputter $SiN_y$ serving as the second insulating layer with 50 nm, and the PECVD $SiN_z$ serving as the third insulating layer with 350 nm. Further, FIG. 8 indicates that the insulating layer including the three layers according to the present invention has the function of suppressing the reduction of the semiconductor by preventing diffusion of the hydrogen atoms emitted from the third insulating layer.

As described above, the insulating layer which includes three layers or more each having separate functions is effective for realizing both of the function of preventing diffusion of the hydrogen atoms and the function of suppressing reduction of the oxide semiconductor.

In the case where those insulating layers are formed in a lower part of the oxide semiconductor, the insulating layers become the barrier coating layers 10a and 10b, and the gate insulating layer 12 illustrated in FIG. 1A, or the barrier coating layer 10a and the first and second gate insulating layers 12a and 12b illustrated in FIG. 1B. In the case where those insulating layers are formed in an upper part of the oxide semiconductor, the insulating layers become the protective layers 16 to 18 illustrated in FIGS. 1A and 1B.

Hereinafter, the oxide semiconductor device according to the present invention is described with an example of a field effect transistor.

(Bottom-Gate/Bottom-Contact Oxide Semiconductor Field Effect Transistor)

Figure 9:
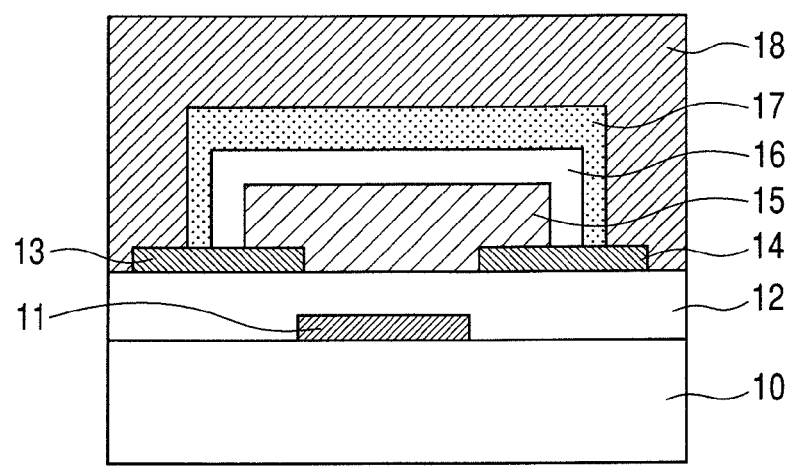
FIG. 9 is a schematic view illustrating a bottom-gate/bottom-contact oxide semiconductor field effect transistor in which the insulating layer of the present invention is used.

With the use of the above-mentioned amorphous oxide semiconductor and insulating layers, a bottom-gate/bottom-contact thin film transistor of FIG. 9 can be manufactured.

Hereinafter, a field effect transistor, that is, one of the oxide semiconductor devices in which the insulating layer according to the present invention is used as the protective layer is sequentially described with the use of FIG. 9 as an example.

First, an electrode layer for forming the gate electrode 11 is formed on the substrate 10. As the substrate 10, there can be used a plastic film or a sheet which is made of polyethylene terephthalate (PET), polyethylene naphthalate (PEN), or polyimide, polycarbonate, and is effective in a manufacturing process performed at a temperature of 250° C. or less. As a matter of course, a glass substrate or a stainless substrate may be used. The gate electrode may be formed by using sputtering, pulsed laser vapor deposition method (PLD), electron-beam evaporation, chemical vapor deposition (CVD), and the like. The electrode material may be any material having satisfactory electrical conductivity. For example, oxide conductors such as $In_2O_3$:Sn, ZnO, and $In_xZn_yO$, and metal electrode materials of metals such as Pt, Au, Ni, Al, and Mo and their alloys, and their laminated films may be used. Next, a pattern of the gate electrode 11 is formed by using photolithography. Then, the gate insulating layer 12 is formed on the substrate 10 having the patterned gate electrode 11. The gate insulating layer may be formed by using sputtering, pulsed laser vapor deposition method (PLD), electron-beam evaporation, chemical vapor deposition (CVD), and the like. The gate insulating material may be any material having satisfactory insulating property and irreducible property with respect to the oxide semiconductor. For example, $SiO_x$ formed by sputtering can be used. Next, an electrode layer for forming the source electrode 13 and the drain electrode 14 is formed. The electrode layer may be formed by using the same method and material as those of the gate electrode 11. After that, the source electrode 13 and the drain electrode 14 are formed by using photolithography.

The oxide semiconductor layer 15 including an oxide film is formed on the gate insulating layer 12 including the patterned source electrode 13 and drain electrode 14. The oxide semiconductor layer 15 may be manufactured by using sputtering, PLD, electron-beam evaporation, CVD, and the like. The oxide semiconductor layer 15 is patterned by using photolithography and etching.

Then, $SiO_x$ with a thickness of 50 nm or more is formed on the oxide semiconductor by sputtering as the first insulating layer 16 having the function of suppressing reduction. Thereon, $SiN_y$ with a thickness of 50 nm or more is formed by sputtering as the second insulating layer 17 having the function of suppressing transmission of the hydrogen atoms. Further thereon, $SiN_z$ serving as the third insulating layer 18 is formed by PECVD. When a plastic substrate or the like with low heat resistance is used, a temperature for forming the $SiN_z$ layer is set to 250° C. or less, and the layer contains a large amount of hydrogen. After that, contact holes are formed in the protective layers 16 to 18 by photolithography and etching, thereby completing the oxide semiconductor field effect transistor.

In the present invention, as described above, the multiple oxide semiconductor field effect transistors can be two-dimensionally (vertically and horizontally in plane) arranged on the substrate.

(Bottom-Gate/Top-Contact Oxide Semiconductor Field Effect Transistor)

Figure 12A:
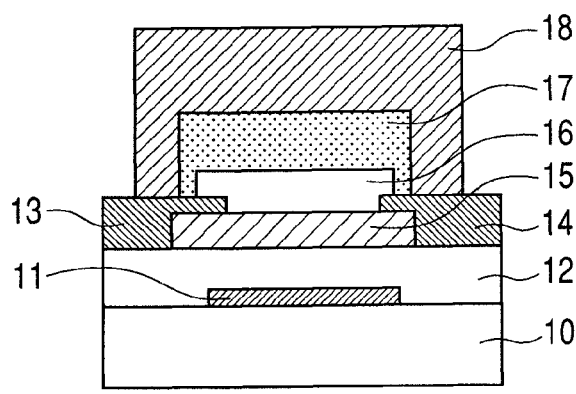
FIGS. 12A, 12B, 12C, and 12D are schematic views illustrating a bottom-gate/bottom-contact oxide semiconductor field effect transistor in which the insulating layer of the present invention is used.
Figure 12B:
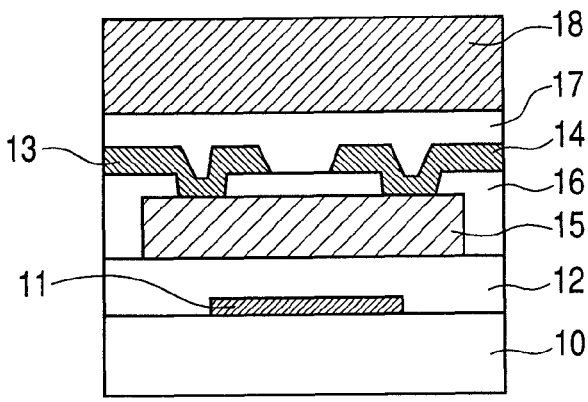

FIG. 12A illustrates a bottom-gate/top-contact thin film transistor in which the insulating layer according to the present invention is used as the protective layer. The gate electrode 11, the gate insulating layer 12, the oxide semiconductor layer 15, the source electrode 13 and the drain electrode 14, and the first to third insulating layers 16 to 18 functioning as the protective layers are formed in the same manner as in the description for FIG. 9, thereby obtaining the structure of FIG. 12A. In this case, the first insulating layer 16, or the first and second insulating layers 16 and 17 may be deposited before the source electrode 13 and the drain electrode 14 are formed, and then those first and second insulating layers are subjected to patterning by using photolithography, thereby obtaining the structure of FIG. 12B or 12C. In any of the structures of FIGS. 12A to 12C, the three-layered insulating layer is formed on the oxide semiconductor layer.

Subsequently, a bottom-gate/top-contact thin film transistor in which the insulating layer according to the present invention is used as an underlying layer (including barrier coating layer and gate insulating layer), is sequentially described, with the use of FIG. 12D as an example.

Figure 12C:
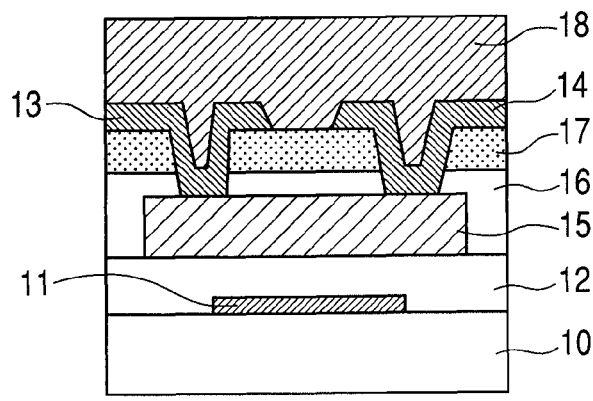
Figure 12D:
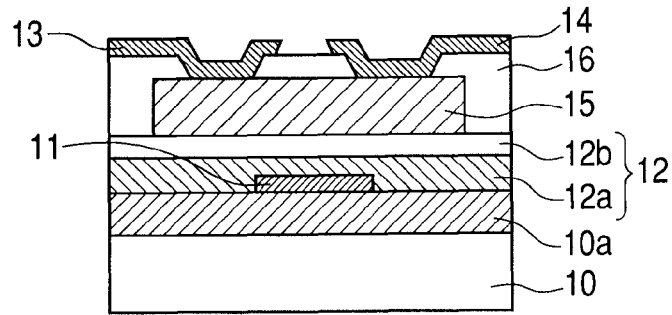

The barrier coating layer (third insulating layer) 10a of $SiN_z$ is formed on the substrate 10 illustrated in FIG. 12D by PECVD, and thereon, the gate electrode 11 made of a metal is formed. $SiN_y$ with a thickness of 50 nm or more is formed by sputtering as the second gate insulating layer (second insulating layer) 12a having the function of preventing diffusion of the hydrogen atoms from the barrier coating layer, and further $SiO_x$ with a thickness of 50 nm or more is formed thereon by sputtering as the first gate insulating layer (first insulating layer) 12b having the function of suppressing reduction of the oxide semiconductor.

After that, the oxide semiconductor layer 15 and the first insulating layer serving as the protective layer 16 are formed. Contact holes are formed in the first insulating layer 16, and the source electrode 13 and the drain electrode 14 are formed, thereby completing the bottom-gate/top-contact thin film transistor. When the insulating layer including the three layers according to the present invention is used as the underlying layer (gate insulating layer and barrier coating layer), the large amount of hydrogen which is contained in the barrier coating layer has no effects, whereby there can be provided an oxide semiconductor device with low leak current, which can be formed in a low temperature process at a temperature of 250° C. or less.

In the present invention, as described above, the multiple bottom-gate/top-contact thin film transistors can be two-dimensionally (vertically and horizontally in plane) arranged on the substrate.

(Top-Gate/Bottom-Contact Oxide Semiconductor Field Effect Transistor)

Figure 13A:
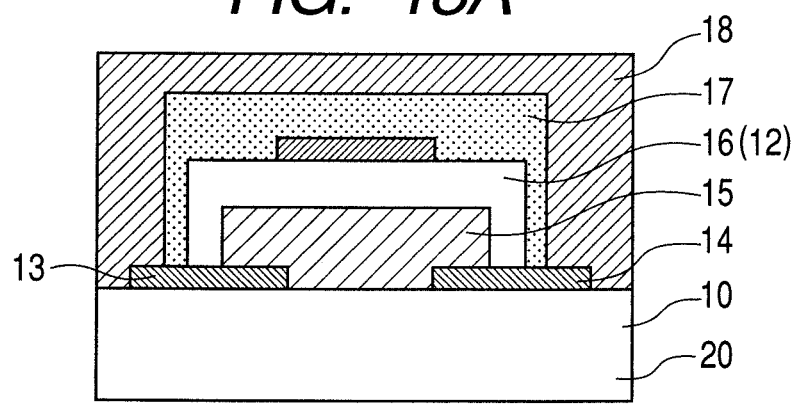
FIGS. 13A, 13B, and 13C are schematic views illustrating a top-gate oxide semiconductor field effect transistor in which the insulating layer of the present invention is used.
Figure 13B:
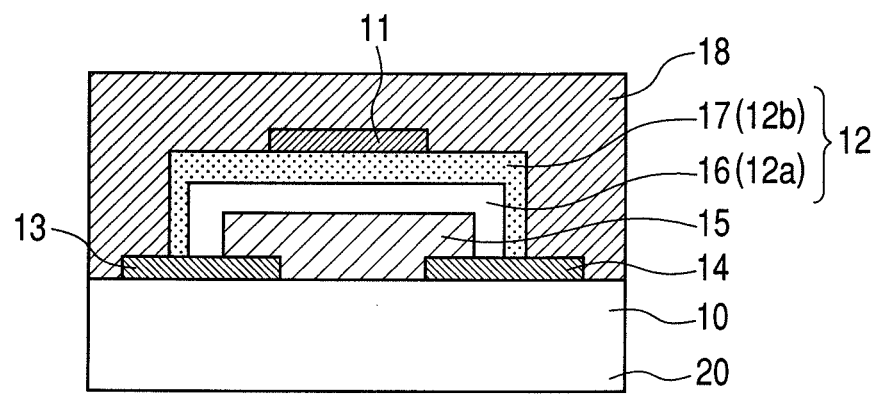

FIG. 13A illustrates a top-gate/bottom-contact thin film transistor in which the insulating layer according to the present invention is used as the protective layer. The source electrode 13 and the drain electrode 14, the oxide semiconductor layer 15, the gate electrode 11, and the first to third insulating layers 16 to 18 functioning as the gate insulating layer and the protective layers are formed in the same manner as in the description for FIG. 9. In this case, the first insulating layer 16, which has the function of suppressing reduction of the oxide semiconductor, also serves as the gate insulating layer 12. The second insulating layer 17 has the function of preventing the hydrogen diffusion from the third insulating layer 18. Further, as illustrated in FIG. 13B, the first insulating layer 16 having the function of suppressing reduction of the oxide semiconductor and the second insulating layer 17 having the function of preventing the hydrogen diffusion may be used as the first gate insulating layer 12a and the second gate insulating layer 12b, respectively, and then this laminated film may be used as the gate insulating layer 12. In any of the structures of FIGS. 13A and 13B, the three-layered insulating layer is formed on the oxide semiconductor.

Figure 13C:
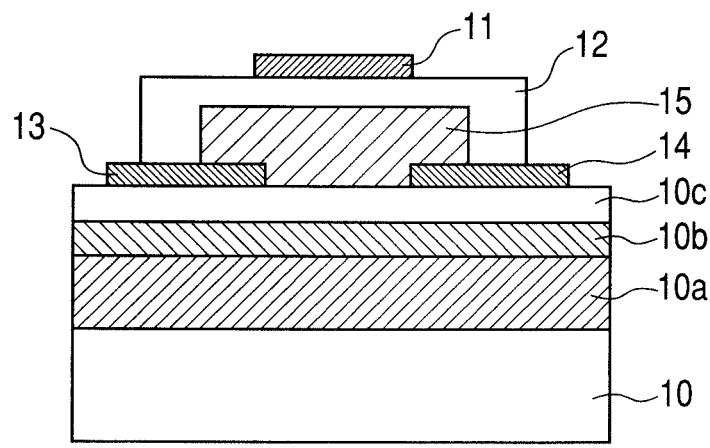

Further, FIG. 13C illustrates a top-gate/bottom-contact thin film transistor in which the insulating layer according to the present invention is used as the underlying layer.

First, the barrier coating layer (third insulating layer) 10a of $SiN_z$ is formed on the substrate 10 by PECVD. When a plastic substrate or the like with low heat resistance is used, the barrier coating layer is formed at a temperature of 250° C. or less, and the large amount of hydrogen is contained therein. Thereon, $SiN_y$ is formed with a thickness of 50 nm or more by sputtering to serve as the second insulating layer 10b having the function of preventing diffusion of the hydrogen atoms. Further, $SiO_x$ is formed thereon with a thickness of 50 nm or more by sputtering as a first insulating layer 10c having the function of suppressing reduction of an oxide semiconductor interface. After that, the source electrode 13 and the drain electrode 14 are formed. For the formation of those electrodes, there can be used sputtering, PLD, electron-beam evaporation, CVD, and the like. The electrode material may be any material having satisfactory electrical conductivity. For example, oxide conductors such as $In_2O_3$:Sn, ZnO, and $In_xZn_yO$, and metal electrode materials of metals such as Pt, Au, Ni, Al, and Mo can be used.

The source electrode 13 and the drain electrode 14 are patterned by photolithography.

Next, the oxide semiconductor layer 15 formed of an oxide film is formed on the first underlying layer 10c including the patterned source electrode 13 and drain electrode 14. The oxide semiconductor layer 15 may be manufactured by sputtering, PLD, electron-beam evaporation, or the like.

Subsequently, the gate insulating layer 12 is formed on the oxide semiconductor layer 15. The gate insulating layer 12 may be manufactured by using sputtering, PLD, electron-beam evaporation, or the like. The gate insulating material may be any material having satisfactory insulation performance. For example, there can be used $SiO_x$ formed by sputtering. Next, the gate electrode 11 is formed. The gate electrode 11 can be formed in the same manner with the same material as those for the source electrode 13 and the drain electrode 14. Thus, the oxide semiconductor field effect transistor is completed. When the insulating layer including the three layers according to the present invention is used as the underlying layer, the large amount of hydrogen which is contained in the barrier coating layer has no effects, whereby there can be provided an oxide semiconductor device with low leak current, which can be formed in a low temperature process at a temperature equal to or lower than 250° C.

In the present invention, as described above, the multiple oxide semiconductor field effect transistors can be two-dimensionally (vertically and horizontally in plane) arranged on the substrate.

(Oxide Semiconductor Field Effect Transistor Including Underlying Layer and Protective Layer)

An oxide semiconductor field effect transistor in which the insulating layer according to the present invention is used as the underlying layer and the protective layer is described below.

As illustrated in FIG. 1A, the first barrier coating layer 10a (third insulating layer) and the second barrier coating layer 10b (second insulating layer) having the function of preventing the hydrogen diffusion are deposited on the substrate 10. After that, the bottom-gate field effect transistor or top-gate field effect transistor, which is described in FIGS. 9 and 12A to 12D, or in FIGS. 13A to 13C, is formed. Further, as illustrated in FIG. 1B, when the bottom-gate field effect transistor is formed on the barrier coating layer 10a (third insulating layer) formed of a single layer, the gate insulating layer is made to be a laminated layer of the second insulating layer 12a and the first insulating layer 12b. Besides, the second insulating layer 12a, which becomes contact with the barrier coating layer 10a, may be provided with the function of preventing the hydrogen diffusion.

In the present invention, as described above, the multiple field effect transistors can be two-dimensionally (vertically and horizontally in plane) arranged on the substrate.

(Display Apparatus)

Hereinafter, a description is made on a display apparatus in which the oxide semiconductor field effect transistor according to the present invention is used.

A drain serving as an output terminal of the oxide semiconductor field effect transistor according to the present invention is connected to an electrode of a display device such as an organic electroluminescence (EL) device or a liquid crystal device, whereby the display apparatus can be formed. Hereinafter, a specific example of the configuration of the display apparatus is described with reference to FIG. 14, a sectional view of the display apparatus.

Figure 14:
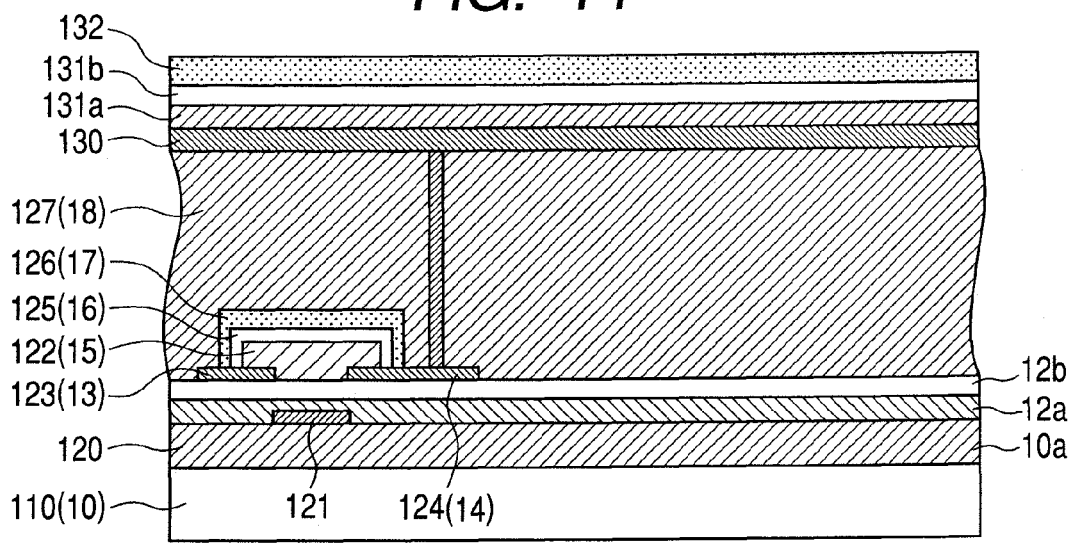
FIG. 14 is a sectional view of a display apparatus according to an exemplary embodiment of the present invention.

As illustrated in FIG. 14, a field effect transistor 120 is formed on a substrate 110 as described above in FIG. 1B. In the present invention, the multiple field effect transistors can be two-dimensionally (vertically and horizontally in plane) arranged on the substrate. An electrode 130 is connected to a drain electrode 124 of the field effect transistor 120, and a hole transport layer 131a and an emission layer 131b are formed on the electrode 130. Further, an electrode 132 is formed on the emission layer 131b. With this structure, a current which is allowed to flow into the emission layer 131b can be controlled based on a value of a current which flows from a source electrode 123 to the drain electrode 124 through a channel formed in an amorphous oxide semiconductor layer 122. Accordingly, the value of the current can be controlled based on a voltage of a gate electrode 121 of the field effect transistor 120. Here, the electrode 130, the hole transport layer 131a, the emission layer 131b, and the electrode 132 form an organic electroluminescence device. Note that FIG. 14 also illustrates a first insulating layer 125, a second insulating layer 126, a third insulating layer 127, the third insulating layer 10a serving as the barrier coating layer, the second insulating layer 12a serving as the gate insulating layer, and the first insulating layer 12b serving as the gate insulating layer.

Figure 15:
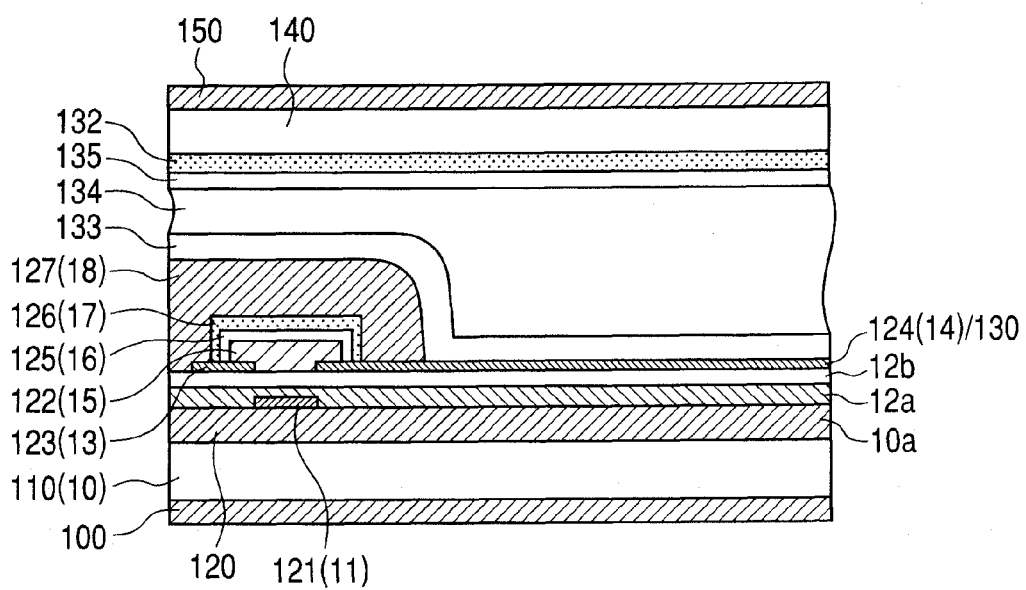
FIG. 15 is a sectional view of a display apparatus according to another exemplary embodiment of the present invention.

Alternatively, as illustrated in FIG. 15, the drain electrode 124 is extended and connected to the electrode 130, and hence there can be obtained the structure in which the drain electrode 124 is used as the electrode 130 that applies a voltage to a liquid crystal cell or electrophoretic particle cell 134 that is sandwiched between high resistance layers 133 and 135. The liquid crystal cell or electrophoretic particle cell 134, the high resistance layers 133 and 135, the electrode 130, and the electrode 132 form a display device. A voltage applied to the display device can be controlled based on the value of the current which flows from the source electrode 123 to the drain electrode 124 through the channel formed in the amorphous oxide semiconductor layer 122, via a storage capacitor which is not illustrated in FIG. 15. Accordingly, the value of the current can be controlled based on the voltage of the gate electrode 121 of the field effect transistor (TFT) 120. In this case, when a display medium of the display device is a capsule which seals fluid and particles in an insulating film, the high resistance layers 133 and 135 are not required. Components denoted by other reference numerals in FIG. 15 represent the same as those of FIG. 14.

(Bottom-Gate/Coplanar Oxide Semiconductor Field Effect Transistor)

Figure 16:
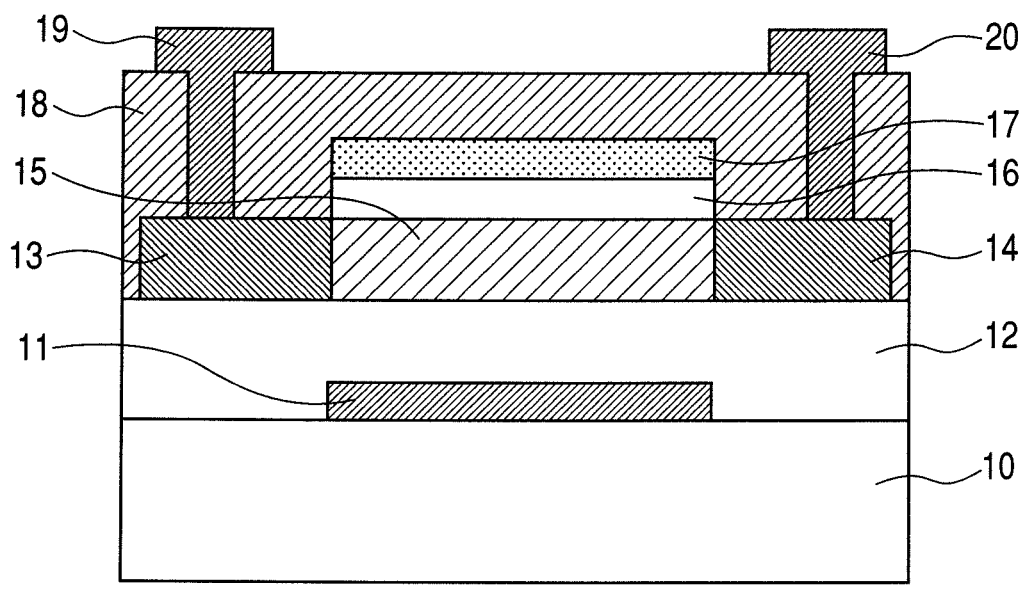
FIG. 16 is a schematic view illustrating a bottom-gate/coplanar oxide semiconductor field effect transistor in which the insulating layer of the present invention is used.

FIG. 16 illustrates a bottom-gate/coplanar oxide semiconductor field effect transistor in which the insulating layer of the present invention is used as the protective layer.

The gate electrode 11, the gate insulating layer 12, and the oxide semiconductor layer 15 are formed as described above with reference to FIG. 9. Then, $SiO_x$ is formed with a thickness of 50 nm or more on an oxide semiconductor by sputtering to be used as the protective layer 16 (first insulating layer) having the function of suppressing reduction of the oxide semiconductor. Thereon, $SiN_y$ is formed with a thickness of 50 nm or more by sputtering to be used as the protective layer 17 (second insulating layer) having the function of suppressing transmission of the hydrogen atoms. Further, the protective layer 16 and the protective layer 17 are patterned by photolithography and etching. In the photolithography, back side exposure may be performed by using the gate electrode 11 as a mask to pattern the protective layers 16 and 17 in a self-aligned manner. Further thereon, the third insulating layer 18 formed of $SiN_z$ is formed by PECVD. As a source gas, an $SiH_4$ gas, an $NH_3$ gas, an $N_2$ gas, and the like are used. Further, a film such as $SiN_z$, $SiO_mN_n$, or SiC may be used. Due to hydrogen generated during the film formation by PECVD, plasma caused by a gas containing hydrogen as an constituent element, or hydrogen diffusion from the formed insulating layer 18, hydrogen is added to a region of the oxide semiconductor layer, which is not covered by the protective layers 16 and 17. In this case, as an adjustment for an amount of hydrogenation, a hydrogenation process may be performed by only using $H_2$ plasma before the film is formed by PECVD. With this hydrogenation, the region of the oxide semiconductor layer, which is not covered by the protective layers 16 and 17, is made to have low resistance, and the source electrode 13 and the drain electrode 14 are formed in a self-aligned manner with respect to the protective layers 16 and 17. Further, in the region of the oxide semiconductor layer, which is not covered by the protective layers 16 and 17, the resistance thereof can be controlled by an RF power density, film-formation temperature, interelectrode distance, a source gas flow rate, or treatment time at the time of the film formation by PECVD.

After that, contact holes are formed in the protective layer 18, and source wiring 19 and drain wiring 20 are formed, whereby the bottom-gate/coplanar oxide semiconductor field effect transistor is completed.

In the present invention, as described above, the multiple bottom-gate/coplanar oxide semiconductor field effect transistors can be two-dimensionally (vertically and horizontally in plane) arranged on the substrate.

Hereinafter, examples of the present invention are described in more detail. However, the present invention is not limited by the following examples.

Example 1

Bottom-Gate/Bottom-Contact Field Effect Transistor

An example in which the bottom-gate/bottom-contact field effect transistor of FIG. 9 is manufactured is described. First, an electrode layer for forming a gate electrode is formed on the glass substrate 10 (manufactured by Corning Inc., #1737) by sputtering. The electrode is formed of Mo and has a thickness of 50 nm.

Then, the electrode is patterned by photolithography and etching to form the gate electrode 11.

Next, an $SiO_x$ film is formed with a thickness of 200 nm by sputtering to serve as the gate insulating layer 12. The $SiO_x$ film is formed with a radio frequency (RF) sputtering apparatus at a substrate temperature of room temperature. A target is $SiO_2$ with a diameter of 3 inches. The RF input power is 400 W. The total pressure of the atmosphere at the film formation is 0.5 Pa, and the gas flow rate at that time is Ar=100%. The source electrode 13 and the drain electrode 14 are formed of indium tin oxide (ITO) and each have a thickness of 150 nm. The source electrode 13 and the drain electrode 14 are patterned by photolithography and etching. The oxide semiconductor layer 15 is formed of an In—Zn—Ga—O amorphous oxide semiconductor material having a thickness of 30 nm. The oxide semiconductor layer 15 is formed with the RF sputtering apparatus at the substrate temperature of room temperature (25° C.). A polycrystalline sintered compact having $In_2O_3$.ZnO composition with a diameter of 3 inches is used as the target, and the RF input power is 200 W. The total pressure of the atmosphere at the time of the film formation is 0.5 Pa, and the gas flow rate at that time is Ar:$O_2$=95:5. After that, photolithography and etching are used to pattern the oxide semiconductor layer 15. On the oxide semiconductor layer 15, as the protective layer 16 (first insulating layer) and the protective layer 17 (second insulating layer), $SiO_x$ with a thickness of 50 nm and $SiN_y$ with a thickness of 50 nm are sequentially deposited by sputtering. For the deposition of $SiO_x$ by sputtering, $SiO_2$ with a diameter of 3 inches is used as the target, and the RF input power is 400 W. The total pressure of the atmosphere at the time of the $SiO_x$ film formation is 0.1 Pa, and the gas flow rate at that time is Ar:$O_2$=50:50. For the deposition of $SiN_y$ by sputtering, $Si_3N_4$ with a diameter of 3 inches is used as the target, and the RF input power is 400 W. The gas flow rate at the time of the $SiN_y$ film formation is Ar:$N_2$=50:50. In addition, $SiN_z$ is formed with a thickness of 300 nm by PECVD as the protective layer 18 (third insulating layer). The substrate temperature at the time of the $SiN_z$ film formation by PECVD is set to 250° C. As process gases, an $SiH_4$ gas, an $NH_3$ gas, and an $N_2$ gas are used. The gas flow rate is set to $SiH_4$:$NH_3$:$N_2$=1:2.5:25. An RF input power density and a pressure are set to 0.9 W/cm$^2$ and 150 Pa, respectively. Then, contact holes are formed in those protective layers by photolithography and etching. As described above, the bottom-gate/bottom-contact field effect transistor of the present invention is completed.

The bottom-gate/bottom-contact field effect transistor manufactured according to this example exhibits excellent characteristics with regard to hysteresis characteristics, uniformity, high-speed operability, and the like, and is stable with respect to an atmosphere.

Example 2

An example in which the bottom-gate/top-contact field effect transistor of FIG. 12D is manufactured is described.

First, on the glass substrate 10 containing an alkali metal, the barrier coating layer 10a is formed of $SiN_z$ at a temperature of 250° C. by PECVD. Thereon, the gate electrode 11 is patterned by using photolithography, lift-off, and electron-beam evaporation. The gate electrode 11 is a laminated layer of Ti of 5 nm/Au of 40 nm/Ti of 5 nm, which is deposited on the barrier coating layer 10a by electron-beam evaporation.

Next, the laminated structure of the gate insulating layer 12a formed of $SiN_y$ and the gate insulating layer 12b formed of $SiO_x$ is used, and $SiN_y$ with a thickness of 150 nm and $SiO_x$ with a thickness of 50 nm are sequentially deposited, respectively, at room temperature (25° C.) by sputtering as in Example 1. The gate insulating layer 12b functions as the underlying layer of the oxide semiconductor layer 15. The oxide semiconductor layer 15 is formed of the same In—Zn—Ga—O amorphous oxide semiconductor material having a thickness of 30 nm as that of Example 1.

Then, the protective layer 16 (first insulating layer) also serving as an etching stopper layer, the source electrode 13, and the drain electrode 14 are formed.

As the protective layer 16 (first insulating layer) also serving as the etching stopper layer, $SiO_x$ is formed with a thickness of 100 nm at room temperature (25° C.) by sputtering as in Example 1. Further, the contact holes are formed in the protective layer 16 (first insulating layer) by photolithography and etching.

As the electrode material for the source electrode 13 and the drain electrode 14, ITO is used, and a thickness thereof is 150 nm. The source electrode 13 and the drain electrode 14 are patterned by photolithography and etching.

Next, annealing is performed in a furnace at an atmospheric temperature of 250° C. for 0.5 hours to increase the electrical conductivity of the source electrode 13 and the drain electrode 14. Thus, the bottom-gate/top-contact field effect transistor of the present invention is completed.

The bottom-gate/top-contact field effect transistor manufactured according to this example exhibits excellent characteristics with regard to hysteresis characteristics, uniformity, high-speed operability, and the like.

Example 3

This example is an example in which the barrier coating layer 10a of Example 2 is formed of $SiO_mN_n$ at the substrate temperature of 250° C. by PECVD. When the $SiO_mN_n$ is formed, the substrate temperature is set to 250° C. As process gases, an $SiH_4$ gas, an $N_2O$ gas, and an $N_2$ gas are used. The gas flow rate is set to $SiH_4$:$N_2O$:$N_2$=1:2.5:10. An RF input power density and a pressure are set to 0.25 W/cm$^2$ and 150 Pa, respectively. Instead of the $N_2$ gas, an $NH_3$ gas may be used. After the barrier coating layer 10a is formed, other components are formed in the same manner as in Example 2. Thus, the bottom-gate/top-contact field effect transistor of the present invention is completed.

The bottom-gate/top-contact field effect transistor manufactured according to this example exhibits excellent characteristics with regard to hysteresis characteristics, uniformity, high-speed operability, and the like.

Example 4

Bottom-Gate/Top-Contact Field Effect Transistor

An example in which the bottom-gate/top-contact field effect transistor of FIG. 12C is manufactured is described.

First, the gate electrode 11 is patterned on the glass substrate 10 (manufactured by Corning Inc., #1737) by photolithography and etching. The gate electrode 11 is formed of Mo on the glass substrate 10 by sputtering to have a thickness of 50 nm.

Next, an $SiO_2$ film is formed with a thickness of 200 nm as the gate insulating layer 12 by sputtering as in Example 1. The oxide semiconductor layer 15 is formed of the same In—Zn—Ga—O amorphous oxide semiconductor material having a thickness of 30 nm as that of Example 1.

After that, the oxide semiconductor layer 15 is patterned by photolithography and etching.

Then, the protective layer 16 (first insulating layer) and the protective layer 17 (second insulating layer) which also serve as an oxide semiconductor protective layer, the source electrode 13, and the drain electrode 14 are formed.

The laminated structure of $SiO_x$ and $SiN_y$ is used for the protective layers 16 and 17 which also serve as the oxide semiconductor protective layer, and $SiO_x$ with a thickness of 50 nm and $SiN_y$ with a thickness of 100 nm are sequentially deposited by sputtering as in Example 1. In addition, the protective layers 16 and 17 are patterned by photolithography and etching.

As the electrode material for the source electrode 13 and the drain electrode 14, ITO is used, and a thickness thereof is 150 nm. The source electrode 13 and the drain electrode 14 are patterned by photolithography and etching.

Further, as the protective layer 18 (third insulating layer), $SiN_z$ is formed with a thickness of 300 nm by PECVD. Besides, the contact holes are formed in the protective layer 18 by photolithography and etching. Thus, the bottom-gate/top-contact field effect transistor of the present invention is completed.

The bottom-gate/top-contact field effect transistor manufactured according to this example exhibits excellent characteristics with regard to hysteresis characteristics, uniformity, high-speed operability, and the like, and is stable with respect to an atmosphere.

Example 5

Top-Gate/Bottom-Contact Field Effect Transistor

An example in which the top-gate/bottom-contact field effect transistor of FIG. 13B is manufactured is described.

First, the source electrode 13 and the drain electrode 14 which are formed of ITO similarly to Example 1 are formed on the glass substrate 10 (manufactured by Corning Inc., #1737) by sputtering. Note that the source electrode 13 and the drain electrode 14 have a thickness of 50 nm.

Then, the electrodes are patterned by photolithography and etching to obtain the source electrode 13 and the drain electrode 14.

Next, on the glass substrate 10 including the source electrode 13 and the drain electrode 14, the same In—Zn—Ga—O amorphous oxide semiconductor layer 15 as that of Example 1 is formed with a thickness of 30 nm. After that, the oxide semiconductor layer 15 is patterned by photolithography and etching.

Then, the gate insulating layers 16 (12a) and 17 (12b) are deposited by sputtering as in Example 1. The thickness of $SiO_x$ is set to 50 nm to serve as the gate insulating layer 16 (12a), and the thickness of $SiN_y$ is set to 150 nm to serve as the gate insulating layer 17 (12b). ITO is used for the gate electrode material and is deposited with a thickness of 50 nm by sputtering. The deposited ITO is subjected to patterning by photolithography and etching to form the gate electrode 11. Further, $SiN_z$ is formed with a thickness of 300 nm by PECVD as the protective layer 18 (third insulating layer). The contact holes are formed in the protective layer 18 by photolithography and etching. Thus, the top-gate/bottom-contact field effect transistor of the present invention is completed.

The top-gate/bottom-contact field effect transistor manufactured according to this example exhibits excellent characteristics with regard to hysteresis characteristics, uniformity, high-speed operability, and the like, and is stable with respect to an atmosphere.

Example 6

An example in which the top-gate/bottom-contact field effect transistor of FIG. 13C is manufactured is described.

First, on a heat resistant polyimide substrate 10, the barrier coating layer 10a (third insulating layer) is formed with a thickness of 300 nm by PECVD at a temperature of 250° C. Thereon, as the second insulating layer 10b, $SiN_y$ is formed with a thickness of 50 nm by sputtering at room temperature (25° C.) under the same conditions as in Example 1. Further thereon, as the first insulating layer 10c, SiO$_x$ is formed with a thickness of 100 nm by sputtering at room temperature (25° C.). An electrode layer for forming the source electrode 13 and the drain electrode 14 is formed by sputtering at room temperature (25° C.). As the electrode material, indium tin oxide (ITO) is used, and a thickness thereof is 50 nm.

Then, the electrode layer is subjected to patterning by photolithography and etching to form the source electrode 13 and the drain electrode 14.

Next, the same In—Zn—Ga—O amorphous oxide semiconductor layer as that of Example 1 is formed with a thickness of 30 nm. After that, the oxide semiconductor layer 15 is patterned by photolithography and etching.

Then, the gate insulating layer 12 and the gate electrode 11 are formed.

SiO$_x$ is used as the gate insulating layer material and is deposited with a thickness of 100 nm by sputtering. The gate insulating layer 12 is patterned by photolithography and lift-off.

Mo is used as the gate electrode material and is deposited with a thickness of 100 nm by sputtering. The gate electrode 11 is patterned by photolithography and etching.

Next, annealing is performed in a furnace at an atmospheric temperature of 250° C. for 0.5 hours to increase the electrical conductivity of the source electrode 13 and the drain electrode 14. Thus, the top-gate/bottom-contact field effect transistor of the present invention is completed.

The top-gate/bottom-contact field effect transistor manufactured according to this example exhibits excellent characteristics with regard to hysteresis characteristics, uniformity, high-speed operability, and the like.

Example 7

Bottom-Gate/Bottom-Contact Field Effect Transistor Including Underlying Layer and Protective Layer An example in which the bottom-gate/bottom-contact field effect transistor formed on the barrier coating layer of FIG. 1B is manufactured is described.

First, on the heat resistant polyimide substrate 10, as the barrier coating layer 10a (third insulating layer), SiN$_z$ is formed with a thickness of 100 nm by PECVD at a temperature of 250° C. Then, an electrode layer for forming the gate electrode on the barrier coating layer 10a is formed by sputtering. As the electrode material, Mo is used, and a thickness thereof is 50 nm. After that, the electrode layer is subjected to patterning by photolithography and etching to form the gate electrode 11.

The gate insulating layer 12a (second insulating layer) and the gate insulating layer 12b (first insulating layer) are deposited by sputtering as in Example 1. SiN$_y$ is formed with a thickness of 150 nm to serve as the gate insulating layer 12a and SiO$_x$ is formed with a thickness of 50 nm to serve as the gate insulating layer 12b, respectively. After the gate insulating layer 12a and the gate insulating layer 12b are formed, other components are formed in the same manner as in Example 1.

The bottom-gate/bottom-contact field effect transistor manufactured according to this example exhibits excellent characteristics with regard to hysteresis characteristics, uniformity, high-speed operability, and the like, and is stable with respect to an atmosphere.

Example 8

In this example, the display apparatus of FIG. 14, in which the bottom-gate/bottom-contact field effect transistor is used, is described. The manufacturing process of the field effect transistor is the same as that of Example 1. Note that, any of the field effect transistors illustrated in FIGS. 1A, 1B, 9, 12A to 12D, and 13A to 13C may be used. Then, the electrode 130 is formed above the drain electrode 124 of the field effect transistor 120 through the protective layer 127. The electrode 130 is formed of ITO which is formed by sputtering. The hole transport layer 131a and the emission layer 131b are formed on the electrode 130 by vapor deposition method. The hole transport layer 131a and the emission layer 131b are formed of α-NPD and Alq$_3$, respectively. Further, the electrode 132 is formed on the emission layer 131b by vapor deposition method. MgAg is used as the electrode material. Thus, the display apparatus illustrated in FIG. 14, in which the organic electroluminescence device is used as the display device, is manufactured.

Example 9

In this example, the display apparatus of FIG. 15, in which the bottom-gate/bottom-contact field effect transistor is used, is described. The manufacturing process of the field effect transistor is the same as that of Example 1. Note that, any of the field effect transistors illustrated in FIGS. 1A, 1B, 9, 12A to 12D, and 13A to 13C may be used. In the field effect transistor 120, short sides of the ITO island film which forms the drain electrode 124 are extended to 100 μm. Except for 90 μm of the extended portion, the field effect transistor 120 is covered with the insulating layers 125 to 127 while the drain electrode 124 is electrically connected by wiring to the source electrode 123 and the gate electrode 121. The insulating layers are coated with a polyimide film 133 thereon to perform a rubbing process.

At the same time, an ITO film 132 and a polyimide film 135 are formed on a plastic substrate 140 in the same way and are subjected to a rubbing process. The plastic substrate 140 thus prepared is placed opposite the substrate 110 on which the field effect transistor 120 is formed with a space of 5 μm away from each other. The space is filled with a nematic liquid crystal 134. Further, a pair of polarizing plates 100 and 150 are provided on both sides of this structure obtained as described above. Here, when a voltage is applied to the source electrode 123 of the field effect transistor 120 to change a voltage applied to the gate electrode 121, this voltage change alters light transmittance of only a 30 μm×90 μm region, which is a part of the ITO island film extended from the drain electrode 124. The light transmittance can also continuously be changed with the voltage applied between the source electrode and the drain electrode at a gate voltage at which the field effect transistor 120 is in an ON state. The display apparatus including liquid crystal cells as display devices is thus manufactured, as illustrated in FIG. 15.

Example 10

In this example, with respect to Example 9, the structure, in which a white plastic substrate 110 is used as the substrate on which the field effect transistor is formed, the electrodes of the field effect transistor 120 are alternatively formed of gold, and the polyimide films 133 and 135 and the polarizing plates 100 and 150 are eliminated, is employed. Further, there is adopted the structure in which a space defined between the white plastic substrate 110 and a transparent plastic substrate 140 is filled with capsules 134 containing particles and a fluid encapsulated in an insulating film. In a display apparatus having such a structure, a voltage applied between the extended drain electrode and the ITO film located in the upper portion is controlled by the field effect transistor, and therefore the particles in the capsules move up and down. This movement can control the reflectance of the extended drain electrode region viewed from the transparent substrate side, thereby realizing display.

Example 11

An example in which the bottom-gate/coplanar field effect transistor of FIG. 16 is manufactured is described.

First, the gate electrode 11 is patterned on the glass substrate 10 (manufactured by Corning Inc., #1737) by photolithography and etching. The gate electrode 11 is formed of Mo on the glass substrate 10 by sputtering to have a thickness of 50 nm.

Next, an $SiO_2$ film is formed with a thickness of 200 nm as the gate insulating layer 12 by sputtering as in Example 1. The oxide semiconductor layer 15 is formed of the same In—Zn—Ga—O amorphous oxide semiconductor material having a thickness of 30 nm as that of Example 1.

After that, the oxide semiconductor layer 15 is patterned by photolithography and etching.

Then, the protective layer 16 (first insulating layer) and the protective layer 17 (second insulating layer) are formed.

The laminated structure of $SiO_x$ and $SiN_y$ is used for the protective layers 16 and 17, and $SiO_x$ with a thickness of 50 nm and $SiN_y$ with a thickness of 100 nm are sequentially deposited, respectively, by sputtering as in Example 1. Further, the protective layers 16 and 17 are patterned by photolithography and etching. In the photolithography, back side exposure is performed by using the gate electrode 11 as a mask.

As the protective layer 18 (third insulating layer), $SiN_z$ with a thickness of 300 nm is formed by PECVD as in Example 1. In this case, the region of the oxide semiconductor, which is not covered by the protective layers 16 and 17, is made to have low resistance, whereby the source electrode 13 and the drain electrode 14 are formed.

Then, the contact holes are formed in the protective layer 18 by photolithography and etching.

Mo is used as the electrode material for the source wiring 19 and the drain wiring 20, which have a thickness of 150 nm. The source wiring 19 and the drain wiring 20 are patterned by photolithography and etching. Thus, the bottom-gate/coplanar field effect transistor of the present invention is completed.

The bottom-gate/coplanar field effect transistor manufactured according to this example exhibits excellent characteristics with regard to hysteresis characteristics, uniformity, high-speed operability, and the like, and is stable with respect to an atmosphere.

While the present invention has been described with reference to exemplary examples, it is to be understood that the invention is not limited to the disclosed exemplary examples. The scope of the following claims is to be accorded the broadest interpretation so as to encompass all such modifications and equivalent structures and functions.

This application claims the benefit of Japanese Patent Application No. 2007-313579, filed Dec. 4, 2007, which is hereby incorporated by reference herein in its entirety.

The invention claimed is:

1. An oxide semiconductor device, comprising:
   an oxide semiconductor layer; and
   an insulating layer in contact with the oxide semiconductor layer,
   wherein the insulating layer comprises:
   a first insulating layer in contact with the oxide semiconductor layer, having a thickness of 50 nm or more, and comprising an oxide containing Si and O;
   a second insulating layer in contact with the first insulating layer, having a thickness of 50 nm or more, and comprising a nitride containing Si and N; and
   a third insulating layer in contact with the second insulating layer; and
   wherein the first insulating layer and the second insulating layer each have a hydrogen content of $4 \times 10^{21}$ atoms/cm$^3$ or less, and the third insulating layer has a hydrogen content of more than $4 \times 10^{21}$ atoms/cm$^3$.

2. The oxide semiconductor device according to claim 1, wherein the first insulating layer comprises silicon oxide, the second insulating layer comprises silicon nitride, and the third insulating layer comprises one of silicon nitride and silicon oxynitride.

3. The oxide semiconductor device according to claim 1, wherein the first insulating layer and the second insulating layer are continuously formed to be an insulating layer.

4. The oxide semiconductor device according to claim 1, wherein the oxide semiconductor layer comprises an amorphous oxide semiconductor containing at least one element selected from the group consisting of Sn, In, and Zn.

5. The oxide semiconductor device according to claim 1, wherein at least one of the first insulating layer and the second insulating layer is used as a gate insulating layer.

6. A display apparatus comprising:
   the oxide semiconductor device according to claim 1,
   a display device connected to one of a source electrode and a drain electrode on a substrate.

7. The display apparatus according to claim 6, wherein the display device comprises an electroluminescence device.

8. The display apparatus according to claim 6, wherein the display device comprises a liquid crystal cell.

9. The display apparatus according to claim 6, wherein a plurality of the display devices and a plurality of the oxide semiconductor devices are two-dimensionally arranged on the substrate.

* * * * *